(12) United States Patent
Zommer et al.

(10) Patent No.: US 10,763,201 B2
(45) Date of Patent: Sep. 1, 2020

(54) LEAD AND LEAD FRAME FOR POWER PACKAGE

(71) Applicant: Littelfuse, Inc., Chicago, IL (US)

(72) Inventors: Nathan Zommer, Fort Lauderdale, FL (US); Kang Rim Choi, Cupertino, CA (US)

(73) Assignee: Littelfuse, Inc., Chicago, IL (US)

( * ) Notice: Subject to any disclaimer, the term of this patent is extended or adjusted under 35 U.S.C. 154(b) by 4 days.

(21) Appl. No.: 15/821,822

(22) Filed: Nov. 23, 2017

(65) Prior Publication Data
US 2018/0096918 A1    Apr. 5, 2018

Related U.S. Application Data

(63) Continuation of application No. 14/320,644, filed on Jul. 1, 2014, now Pat. No. 9,842,795, which is a
(Continued)

(51) Int. Cl.
*H01L 23/498* (2006.01)
*H01L 23/495* (2006.01)
(Continued)

(52) U.S. Cl.
CPC .. *H01L 23/49838* (2013.01); *H01L 23/49524* (2013.01); *H01L 23/49541* (2013.01); *H01L 23/49551* (2013.01); *H01L 23/49562* (2013.01); *H01L 23/49844* (2013.01); *H01L 24/37* (2013.01); *H01L 24/40* (2013.01); *H01L 24/48* (2013.01); *H01L 24/84* (2013.01); *H01L 23/3107* (2013.01); *H01L 24/29* (2013.01); *H01L 24/83* (2013.01); *H01L 24/85* (2013.01);
(Continued)

(58) Field of Classification Search
CPC ............... H01L 24/40; H01L 23/49838; H01L 23/49844; H01L 23/49551
See application file for complete search history.

(56) References Cited

U.S. PATENT DOCUMENTS 6,040,626 A    3/2000  Cheah et al.
6,075,286 A *  6/2000  Ewer ................ H01L 23/49562
                                                      257/666
(Continued)

OTHER PUBLICATIONS

Dict.org "Definition: Unitary" (http:www.dict.org/bin/Dict?Form=Dict2Database=*Query=unitary> Accessed Aug. 24, 2015.

*Primary Examiner* — Zandra V Smith
*Assistant Examiner* — Abbigale A Boyle

(57) ABSTRACT

A power device includes a semiconductor chip provided over a substrate, and a patterned lead. The patterned lead includes a raised portion located between a main portion and an end portion. At least part of the raised portion is positioned over the semiconductor chip at a larger height than both the main portion and the end portion. A bonding pad may also be included. The end portion may include a raised portion, bonded portion, and connecting portion. At least part of the bonded portion is bonded to the bonding pad and at least part of the raised portion is positioned over the bonding pad at a larger height than the bonded portion and connecting portion. The end portion may also include a plurality of similarly raised portions.

18 Claims, 5 Drawing Sheets

Related U.S. Application Data continuation of application No. 12/562,049, filed on Sep. 17, 2009, now Pat. No. 8,796,837.

(60) Provisional application No. 61/157,115, filed on Mar. 3, 2009.

(51) Int. Cl.
*H01L 23/00* (2006.01)
*H01L 23/31* (2006.01)

(52) U.S. Cl.
CPC ............... *H01L 2224/05554* (2013.01); *H01L 2224/05599* (2013.01); *H01L 2224/371* (2013.01); *H01L 2224/37599* (2013.01); *H01L 2224/40247* (2013.01); *H01L 2224/45099* (2013.01); *H01L 2224/484* (2013.01); *H01L 2224/4826* (2013.01); *H01L 2224/48091* (2013.01); *H01L 2224/48247* (2013.01); *H01L 2224/73221* (2013.01); *H01L 2224/83* (2013.01); *H01L 2224/83801* (2013.01); *H01L 2224/84* (2013.01); *H01L 2224/84801* (2013.01); *H01L 2224/85* (2013.01); *H01L 2224/92* (2013.01); *H01L 2924/00014* (2013.01); *H01L 2924/014* (2013.01); *H01L 2924/01013* (2013.01); *H01L 2924/01029* (2013.01); *H01L 2924/01033* (2013.01); *H01L 2924/01047* (2013.01); *H01L 2924/01082* (2013.01); *H01L 2924/13091* (2013.01); *H01L 2924/14* (2013.01); *H01L 2924/181* (2013.01)

(56) References Cited

U.S. PATENT DOCUMENTS

| | | | |
|---|---|---|---|
| 6,337,510 B1 | 1/2002 | Chun-Jen et al. | 257/666 |
| 6,534,343 B2 | 3/2003 | Choi | 438/122 |
| 6,731,002 B2 | 5/2004 | Choi | 257/735 |
| 7,391,121 B2 | 6/2008 | Otremba | 257/784 |
| 2007/0057350 A1* | 3/2007 | Otremba | H01L 23/49524 257/666 |
| 2007/0278664 A1 | 12/2007 | Carney et al. | 257/706 |

* cited by examiner

LEAD AND LEAD FRAME FOR POWER PACKAGE

CROSS REFERENCE TO RELATED APPLICATIONS

This application is a continuation of, and claims priority under 35 U.S.C. § 120 from, nonprovisional U.S. patent application Ser. No. 14/320,644 entitled "Lead And Lead Frame For Power Package," filed on Jul. 1, 2014, now U.S. Pat. No. 9,842,795. U.S. patent application Ser. No. 14/320,644, in turn, is a continuation of, and claims priority under 35 U.S.C. § 120 from, nonprovisional U.S. patent application Ser. No. 12/562,049 entitled "Lead And Lead Frame For Power Package," filed on Sep. 17, 2009, now U.S. Pat. No. 8,796,837. U.S. patent application Ser. No. 12/562,049 claims the benefit under 35 U.S.C. § 119 from provisional U.S. patent application Ser. No. 61/157,115 entitled "Lead And Lead Frame For Power Package," filed on Mar. 3, 2009. The entire subject matter of each of the foregoing documents is incorporated herein by reference.

TECHNICAL FIELD

The present invention relates to electronic devices, and more particularly to a lead and lead frame for a packaged power semiconductor device.

BACKGROUND OF THE INVENTION

FIG. 1a illustrates a conventional power device having a wire bonded lead frame. FIG. 1b illustrates a cross-sectional view along line A-A in FIG. 1a. A set of leads (1, 2, 3) is interconnected to a power chip 7 via wires that are soldered to each lead in the set of leads (1, 2, 3) and a corresponding pad (4, 5, 6) provided on the power chip 7. The power chip 7 is provided on a substrate 8 and the resulting structure is encased in a plastic encapsulation 9. The wire bonding is performed as a separate operation after die attaching the power chip 7 to the substrate 8. The leads (1, 2, 3) may each correspond to a gate, source, and drain of the power chip 7, where the source and drain are high current leads and the gate is a low-current lead for a control signal.

In this conventional power device, the wiring requires the use of special bonding techniques, such as ultrasound wire bonding. The required bonding material and wires add resistance to the flow of current. Accordingly, even if the power chip 7 itself is capable of operating with a particular amount of current, the bonding material and wires limit the maximum current of the device to an amount that is less than the amount which the power chip 7 is capable of withstanding.

FIG. 2a illustrates a conventional power device having clip joints. FIG. 2b illustrates a cross-sectional view along line A-A in FIG. 2a. A set of pins (30, 31, 32) is connected to a power transistor 39 via clips (21, 22, 23). Each clip (21, 22, 23) is shaped as a single lead. The power transistor 39 is provided on a metal can package 40. One end of each of the clips (21, 22, 23) is bonded, via a solder joint (24, 25, 26), to a pad (36, 37, 38) coupled to the power transistor 39. The other end of each of the clips (21, 22, 23) includes a hole (33, 34, 35) through which one of the pins (30, 31, 32) extends through and is soldered to an inner surface thereof. The clips (21, 22, 23) may each correspond to one of the base, emitter, and collector of the power transistor 39. Each of the pins (30, 31, 32) also extends through a hole (27, 28, 29) in the metal can package 40.

In this conventional power device, the solder joints (24, 25, 26) are susceptible to mechanical stress between the clips (21, 22, 23) and the power transistor 39, which may result in deterioration from thermal fatigue. The power transistor 39 also has a limited current capacity due to structural elements such as the solder used to couple the pins (30, 31, 32) to the clips (21, 22, 23).

Accordingly, an improved apparatus is desired that solves some of the problems and reduces some of the drawbacks discussed above.

BRIEF SUMMARY OF THE INVENTION

In some embodiments, a power device includes a semiconductor chip provided over a substrate, and a patterned lead. The patterned lead includes a raised portion located between a main portion and an end portion. The end portion is bonded to the semiconductor chip. At least part of the raised portion is positioned over the semiconductor chip at a larger height than both the main portion and the end portion. Positioning at least part of the raised portion over the semiconductor chip at least advantageously increases the electrical isolation between the lead and the semiconductor chip.

In some embodiments, the power device also includes a bonding pad coupled to the semiconductor chip. The end portion may include a raised portion, a bonded portion, and a connecting portion. At least a part of the bonded portion is bonded to the bonding pad via bonding material. At least part of the raised portion is positioned between the bonded portion and the connecting portion and over the bonding pad at a larger height than the bonded portion and the connecting portion. The connecting portion may be coupled to the main portion. Positioning at least part of the raised portion over the bonding pad at least advantageously increases resilience of the bonding material to mechanical stress and heating fatigue.

In some embodiments, the end portion includes a plurality of raised portions. At least a part of each of the raised portions is positioned over the bonding pad at a larger height than corresponding bonded and connecting portions of the end portion. The plurality of raised portions advantageously increases heat dissipation and also increases resilience to mechanical stress and thermal fatigue.

These and other advantages of the invention will be apparent to those of ordinary skill in the art by reference to the following detailed description and the accompanying drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings.

DETAILED DESCRIPTION

The embodiments discussed herein are illustrative of one or more examples of the present invention. As these embodiments of the present invention are described with reference to illustrations, various modifications or adaptations of the methods and/or specific structures described may become apparent to those skilled in the art. All such modifications, adaptations, or variations that rely upon the teachings of the present invention, and through which these teachings have advanced the art, are considered to be within the scope of the present invention. Hence, the present descriptions and drawings should not be considered in a limiting sense, as it is understood that the present invention is in no way limited to only the embodiments illustrated.

Figure 1A:
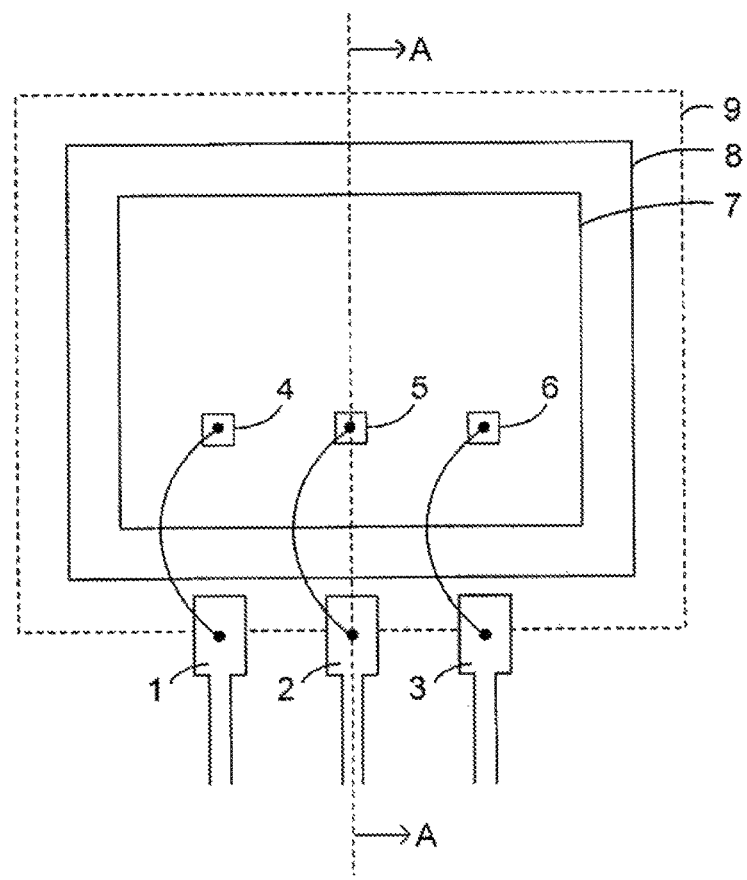
FIG. 1a illustrates a conventional power device having a wire bonded lead frame.
Figure 1B:
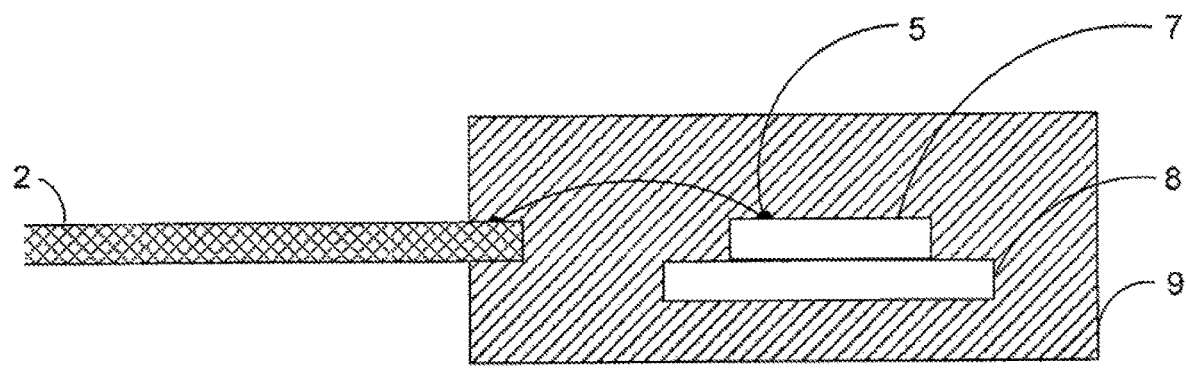
FIG. 1b illustrates a cross-sectional view of a conventional power device having a wire bonded lead frame.
Figure 2A:
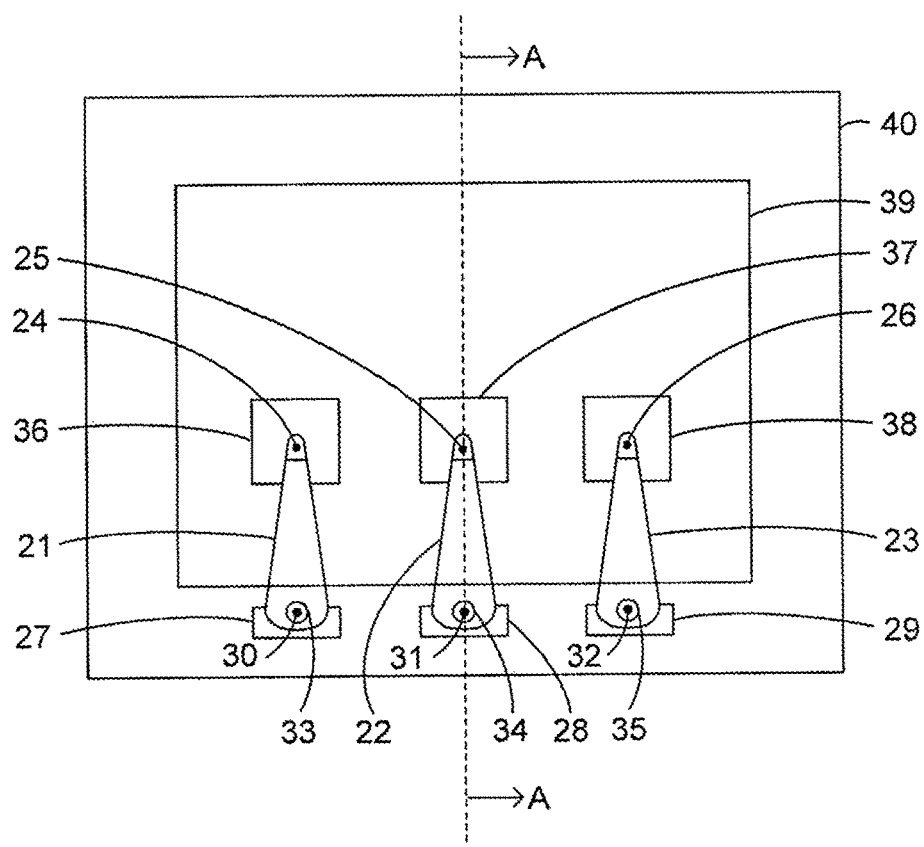
FIGS. 2a illustrates a conventional power device having clip joints.
Figure 2B:
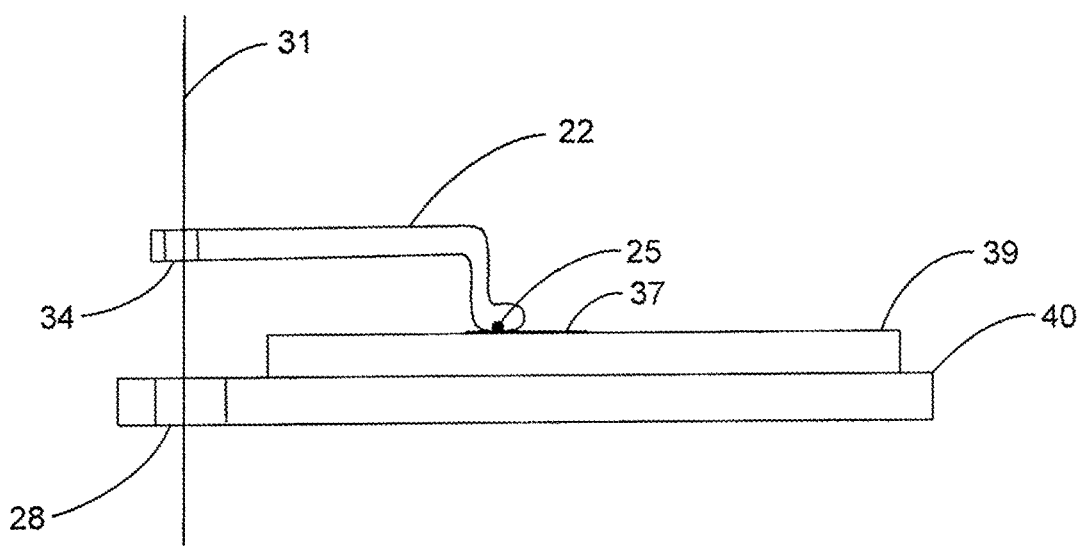
FIGS. 2b illustrates a cross-sectional view of a conventional power device having clip joints.
Figure 3A:
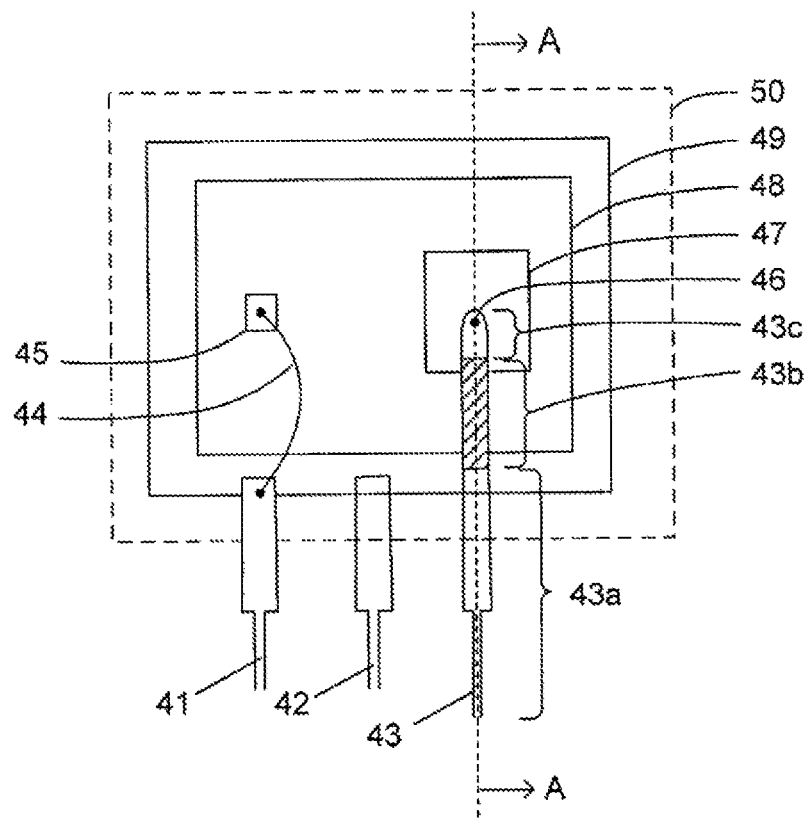
FIG. 3a illustrates a packaged semiconductor device including a lead having a raised portion positioned over a power chip.
Figure 3B:
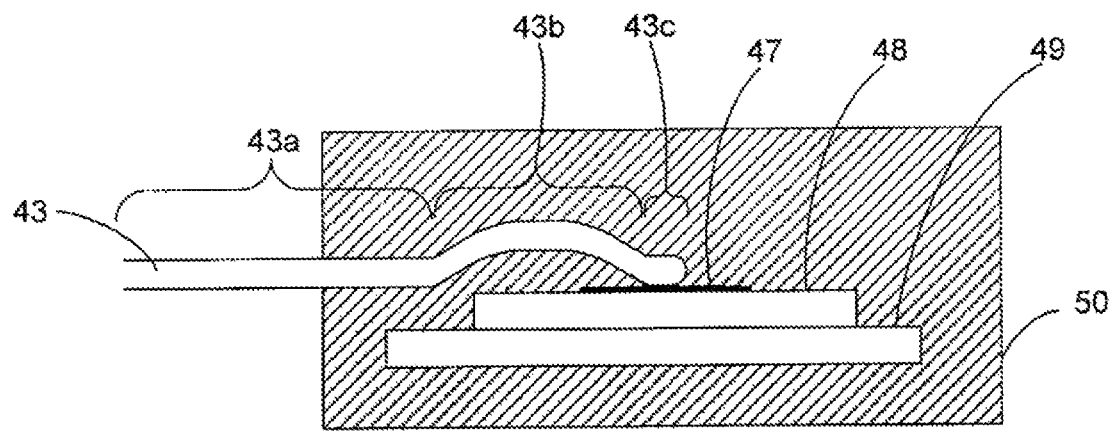
FIG. 3b illustrates a cross-sectional view of a packaged semiconductor device including a lead having a raised portion positioned over a power chip.

FIG. 3a illustrates a top view of a packaged semiconductor device according to one embodiment. FIG. 3b illustrates a cross-sectional view of a packaged semiconductor device along line A-A in FIG. 3a.

Leads (41, 42, 43) are provided (i.e., mechanically and electrically) at any terminal, such as a gate, source, and drain, of a three terminal power chip 48, such as a BJT, MOSFET, and the like. The power chip 48 may be a semiconductor chip packaged as an integrated circuit. The leads (41, 42, 43) may be made from metal having high electrical and/or thermal conductivity, such as copper, silver, brass, and the like. The leads (41, 42, 43) may result from a patterning of a copper layer, silver layer, brass layer, and the like. The leads may result from fully patterning the layers or partially patterning the layers.

The power chip 48 may be provided on or above a substrate 49 and the combined components may be surrounded by an encapsulating material 50. The encapsulating material 50 is typically epoxy, plastic, rubber, silicone, or similar materials and is molded, cast, or otherwise formed around the substrate 49 and related structures. The substrate 49 can be metal, direct bonded copper on ceramic, direct bonded aluminum on ceramic, copper bonded with a polymer on aluminum, ceramic material, or any combination thereof.

One of the leads 41 may be wire bonded, via a wire 44, to a pad 45 coupled to the power chip 48. Such wire bonding techniques are described in U.S. Pat. No. 6,731,002, which is assigned to IXYS Corp. of Milpitas, Calif., and which is incorporated by reference in its entirety. Another one of the leads 42 may be directly bonded to the substrate 49. Such a bonding technique is also described in U.S. Pat. No. 6,731,002, which is assigned to IXYS Corp. of Milpitas, Calif. Another one of the leads 43 may be bonded, via a bonding material 46 such as solder, to a bonding pad 47 coupled to the power device 48. The leads (42, 43) may be solder plated.

The lead 43 may include a main portion 43a, a raised portion 43b, and an end portion 43c. The end portion 43c is bonded, via the bonding material 46, to the bonding pad 47. The main portion 43a is coupled to a lead frame. At least part of the raised portion 43b is positioned above a top surface of the power chip 48 at a height larger than the main portion 43a and the end portion 43c. In other words, a distance from the top surface of the power chip 48 to a bottom surface of at least part of the raised portion 43b is greater than a distance from the top surface of the power chip 48 to a bottom surface of the main portion 43a and is also greater than a distance from the top surface of the power chip 48 to a bottom surface of the end portion 43c. The distance from the top surface of the power chip 48 to the bottom surface of the main portion 43a may be equal to the distance from the top surface of the power chip 48 to the bottom surface of the end portion 43c. Providing at least part of the raised portion 43b above a top surface of the power chip 48 at a height larger than the main portion 43a and the end portion 43c advantageously increases the electrical isolation between the lead 43 and the power chip 48.

The raised portion 43b, when viewed from a top view as illustrated in FIG. 3a, may be in the shape of a straight line, a curved line, a plurality of curved lines, a half-square, a plurality of half-squares, and the like. In one embodiment, as illustrated in FIG. 3a, the raised portion 43b, when viewed from a top view, is in the shape of a straight line. The raised portion 43b, when viewed from a cross-sectional view as illustrated in FIG. 3b, may be in the shape of an arc, a plurality of arcs, a half-square, a plurality of half-squares, and the like. In one embodiment, as illustrated in FIG. 3b, the raised portion 43b, when viewed from a cross-sectional view, is in the shape of an arc.

The lead 43 may be used in place of leads (41, 42). Alternatively, only a single lead 43 or multiple leads 43 are provided. The leads may advantageously be provided in a lead frame as described in U.S. Pat. No. 6,534,343, which is assigned to IXYS Corp. of Milpitas, Calif., and which is incorporated by reference in its entirety, and as described in U.S. Pat. No. 6,731,002, which is assigned to IXYS Corp. of Milpitas, Calif. Special wire-bonding techniques are not required for the lead 43, resulting in reducing bonding costs. The lead 43 also avoids the use of wires and multiple bonding points as compared to conventional techniques, thereby reducing the resistance of a connection to a terminal of the power chip 48.

In one embodiment, the lead 43 is only used for high current power device terminals, such as sources and drains. Alternatively, the lead 43 may be used for low current power device terminals. The bonding of the lead 42 to the substrate 49 and of the lead 43 to the bonding pad 47 of the power device 48 may be done in one step, which may also be the step of attaching the power device 48 to the substrate 49. This bonding may be performed using a solder reflow oven as described in U.S. Pat. No. 6,534,343 and U.S. Pat. No. 6,731,002, both of which are assigned to IXYS Corp. of Milpitas, Calif., for binding a lead frame to a substrate. The lead 43 and/or leads (41, 42) may be provided for multiple power chips on one or more substrates 49.

Figure 4A:
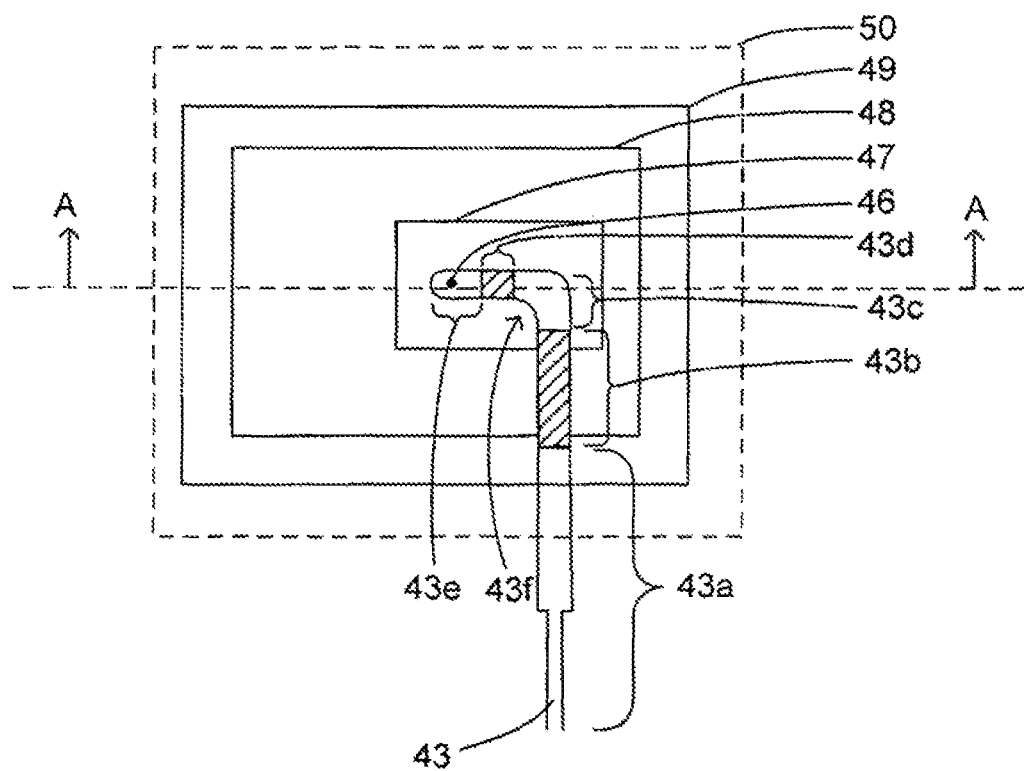
FIG. 4a illustrates a packaged semiconductor device including a lead having an end portion comprising a raised portion positioned over a bonding pad.
Figure 4B:
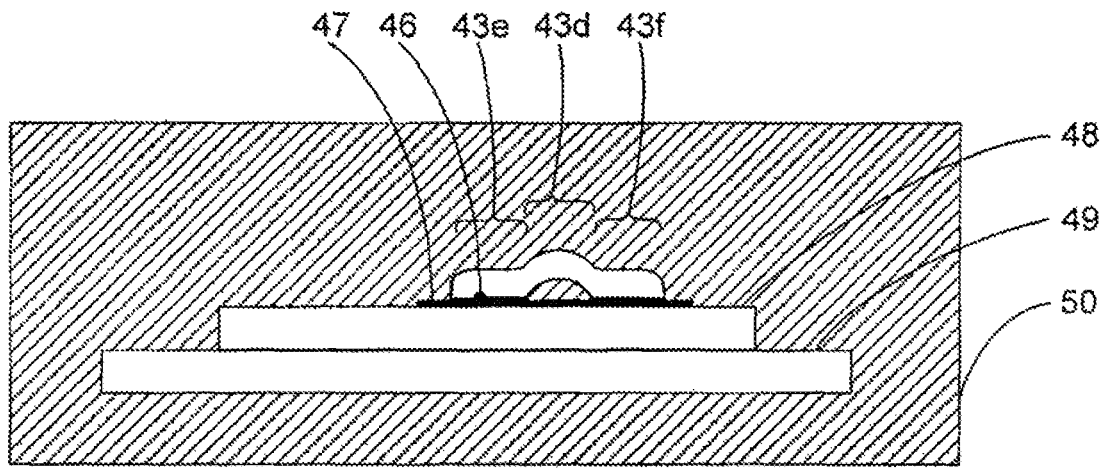
FIG. 4b illustrates a cross-sectional view of a packaged semiconductor device including a lead having an end portion comprising a raised portion positioned over a bonding pad.

FIG. 4a illustrates a top view of a packaged semiconductor device according to one embodiment. FIG. 4b illustrates a cross-sectional view from line A-A in FIG. 4a. FIG. 4a and FIG. 4b show a modification to the lead 43 illustrated in FIG. 3a and FIG. 3b. Accordingly, the implementations and variations described in accordance with the embodiment illustrated in FIG. 3a and FIG. 3b are applicable to the embodiment illustrated in FIG. 4a and FIG. 4b.

In this embodiment, the end portion 43c of the lead 43 includes a raised portion 43d, a bonded portion 43e, and a connecting portion 43f. The bonded portion 43e is coupled to the raised portion 43d, and at least a part of the bonded portion 43e is bonded, via the bonding material 46, to the bonding pad 47. The connecting portion 43f is coupled to the raised portion 43d and the raised portion 43b. The connecting portion 43f may include one or more arcs, bends, and the like, so that the end portion 43c may be provided in the shape of a curved line or provided at any angle relative to the main portion 43a as described below. In one embodiment, there is no raised portion 43b. Accordingly, the connecting portion 43f, and thus the end portion 43c, is directly coupled to the main portion 43a.

The raised portion 43d is located between the bonded portion 43e and the connecting portion 43f. The raised portion 43d has similar characteristics as the raised portion 43b. However, the raised portion 43d is positioned above a top surface of the bonding pad 47 at a height larger than at least the bonding portion 43e. In one embodiment, the raised portion 43d is positioned over a top surface of the bonding pad 47 at a height larger than both the bonding portion 43e and the connecting portion 43f. In other words, a distance from the top surface of the bonding pad 47 to a bottom surface of the raised portion 43d is greater than a distance from the top surface of the bonding pad 47 to a bottom surface of both of the bonding portion 43e and the connecting portion 43f.

The end portion 43c, when viewed from a top view as illustrated in FIG. 4a, may be in the shape of a straight line, a curved line, or provided at any angle relative to the main portion 43a. In one embodiment, as illustrated in FIG. 4a, the end portion 43c is provided to extend at approximately a ninety degree angle relative to the main portion 43a.

Advantageously, the raised portion 43d further increases the resilience of the bonding material 46 to mechanical stress and thus heating fatigue. The stress may be in a direction different than those protected by raised portion 43b, depending on the orientation of the end portion 43c. Advantageously, the increased area of the lead 43 over the bonding pad 47 increases heat conduction from the top surface of the power device 48, resulting in a cooling of the power device 48.

Figure 5:
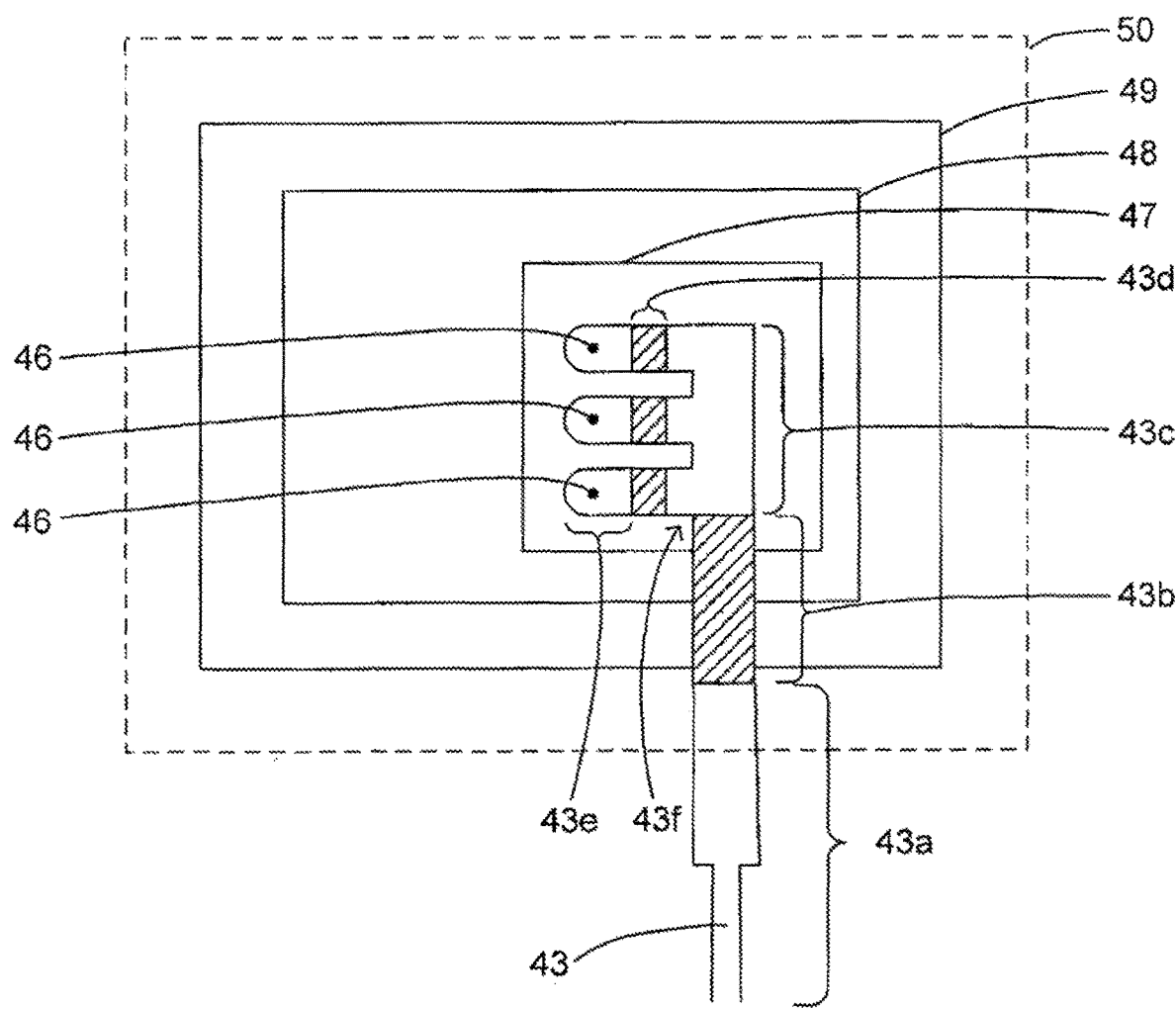
FIG. 5 illustrates a packaged semiconductor device including a lead having a plurality of end portions each comprising a raised portion positioned over a bonding pad.

FIG. 5 illustrates a top view of a packaged semiconductor device according to one embodiment. FIG. 5 shows a modification to the lead 43 illustrated in FIG. 3a, FIG. 3b, FIG. 4a, and FIG. 4b. Accordingly, the implementation and variations described in accordance with the embodiments illustrated in FIG. 3a, FIG. 3b, FIG. 4a, and FIG. 4b are applicable to the embodiment illustrated in FIG. 5.

In this embodiment, the end portion 43c includes multiple portions, or fingers, that are each curved or provided at any angle relative to the main portion 43a. Each finger is provided with a raised portion 43d, a bonded portion 43e, and a connecting portion 43f, each having characteristics as previously described. The raised portion 43d, bonded portion 43e, and connecting portion 43f for each finger may have identical, similar, or different characteristics. For example, the raised portion 43d of one of the fingers may be positioned above a top surface of the bonding pad 47 at a height equal to a height which the raised portion 43d of another one of the fingers is positioned above the top surface of the bonding pad 47. Alternatively, the raised portion 43d of one of the fingers may be positioned above a top surface of the bonding pad 47 at a height greater than or less than a height which the raised portion 43d of another one of the fingers is positioned above the top surface of the bonding pad 47. In some embodiments, the fingers may have equal lengths and widths, or they may have lengths and widths that are different from each other. In some embodiments, the fingers may be provided at the same angle, or at angles that are, relative to the main portion 43a, different from one another. In one embodiment, as illustrated in FIG. 5, the fingers of the end portion 43c all have the same characteristics. Although two or more fingers can be provided, in this embodiment, three fingers are provided—each at an angle of approximately ninety degrees relative to the main portion 43a.

Advantageously, providing multiple fingers facilitates multiple contact points from the lead 43 to the power chip 48. Multiple fingers advantageously increase heat dissipation and increases resilience to mechanical stress and thermal fatigue. The number, size, orientation, and physical properties of the fingers may vary depending on the desired cooling needs and desired resilience to mechanical stress and thermal fatigue.

The above description is illustrative but not restrictive. Many variations of the invention will become apparent to those skilled in the art upon review of the disclosure. For example, a single lead 43 may be provided or multiple leads 43 may be provided. If multiple leads 43 are provided, they may all be the same, such as the lead 43 illustrated in FIG. 3a, or they may all be different, such as the lead 43 illustrated in FIG. 3a and the lead 43 illustrated in FIG. 4A and FIG. 5, or some leads may be the same while others are different. The scope of the invention should, therefore, be determined not with reference to the above description, but instead should be determined with reference to the pending claims along with their full scope of equivalents.

What is claimed is:

1. A power device comprising:
an encapsulating material; and
a semiconductor chip; and
a lead comprising a main portion, a first raised portion, and an end portion having a connecting portion, a second raised portion, and a bonded portion, wherein the main portion is separated from the end portion by the first raised portion, wherein the first raised portion extends from the connecting portion towards the main portion along a first direction, wherein the second raised portion extends from the connecting portion towards the bonded portion along a second direction, wherein the bonded portion is separated from the connecting portion by the second raised portion, wherein the first direction and the second direction are nonparallel, wherein the lead is part of leadframe metal, and wherein the main portion extends from outside the encapsulating material, wherein the bonded portion is electrically connected to the semiconductor chip, wherein the lead is not electrically connected to the semiconductor chip at the main portion, the first raised portion, the connecting portion or at the second raised portion.

2. The power device of claim 1, wherein the end portion of the lead comprises the second raised portion, the bonded portion, and the connecting portion.

3. The power device of claim 1, wherein the main portion of the lead extends along the first direction, and wherein the first direction is perpendicular to the second direction.

4. The power device of claim 1, wherein the second raised portion is not in physical contact with any bonding pad.

5. The power device of claim 1, wherein the connecting portion of the end portion extends along an arc from the first raised portion towards the second raised portion such that the connecting portion forms an arc shaped projection on a surface of a semiconductor device.

6. The power device of claim 1, wherein the lead is a single piece of electrically conductive material formed from a single sheet of the leadframe metal.

7. A power device comprising:
   encapsulating material;
   a semiconductor chip; and
   a lead comprising a main portion, a first raised portion, a connecting portion, a second raised portion, and a bonded portion, wherein the main portion is separated from the connecting portion by the first raised portion, wherein the connecting portion is separated from the bonded portion by the second raised portion, wherein the first raised portion extends from the connecting portion to the main portion along a first axis, wherein the second raised portion extends from the connecting portion to the bonded portion along a second axis, wherein the bonded portion is separated from the connecting portion by the second raised portion, wherein the first and second axes converge, wherein the lead is an integral piece of leadframe metal, and wherein the main portion extends from outside the encapsulating material, wherein the bonded portion is electrically connected to the semiconductor chip, wherein the lead is not electrically connected to the semiconductor chip at the main portion, the first raised portion, the connecting portion or at the second raised portion.

8. The power device of claim 7, wherein at least part of the second raised portion is positioned above a semiconductor device at a greater height than each of the bonded portion, the connecting portion, and the main portion.

9. The power device of claim 7, wherein the main portion extends along a first direction, wherein the first raised portion extends along the first direction, wherein the second raised portion extends along a second direction, and wherein the first direction is perpendicular to the second direction.

10. The power device of claim 7, wherein the second raised portion is not in physical contact with any bonding pad.

11. The power device of claim 7, wherein the connecting portion extends along an arc from the first raised portion towards the second raised portion, and wherein the arc is projected onto a surface of a semiconductor device.

12. The power device of claim 7, wherein the lead is a single piece of electrically conductive material formed from a single sheet of the leadframe metal.

13. A lead frame comprising:
   a semiconductor chip; and
   a lead having a main portion, a first raised portion, a connecting portion, a second raised portion, and a bonded portion, wherein the lead is formed from a single piece of metal, wherein the main portion is separated from the connecting portion by the first raised portion that extends from the main portion to the connecting portion along a first axis, wherein the connecting portion is separated from the bonded portion by the second raised portion that extends from the connecting portion to the bonded portion along a second axis, wherein the bonded portion is separated from the connecting portion by the second raised portion, wherein the first axis and the second axis are noncollinear axes, and wherein the main portion extends from outside encapsulating material, wherein the bonded portion is electrically connected to the semiconductor chip, wherein the lead is not electrically connected to the semiconductor chip at the main portion, the first raised portion, the connecting portion or at the second raised portion.

14. The lead frame of claim 13, wherein at least part of the second raised portion is positioned above a semiconductor chip at a greater height than each of the bonded portion, the connecting portion, and the main portion.

15. The lead frame of claim 13, wherein the lead is a single piece of electrically conductive material that is patterned from a single sheet of a metal layer.

16. The lead frame of claim 13, wherein the main portion extends along a first direction, wherein the first raised portion extends along the first direction, wherein the second raised portion extends along a second direction, and wherein the first direction is not parallel to the second direction.

17. The lead frame of claim 13, wherein the second raised portion is not in physical contact with a bonding pad.

18. The lead frame of claim 13, wherein the connecting portion extends along an arc from the first raised portion towards the second raised portion such that the connecting portion forms an arc shaped projection on a surface of a power semiconductor chip.

* * * * *